United States Patent [19]

Murouchi et al.

[11] Patent Number: 5,504,133
[45] Date of Patent: Apr. 2, 1996

[54] COMPOSITION FOR FORMING CONDUCTIVE FILMS

[75] Inventors: Masato Murouchi, Tanashi; Toshiharu Hayashi; Akira Nishihara, both of Omiya; Masaoki Ishihara, Utsunomiya, all of Japan

[73] Assignees: Mitsubishi Materials Corporation, Tokyo; Dai Nippon Toryo Co., Ltd., Osaka, both of Japan

[21] Appl. No.: 317,363

[22] Filed: Oct. 4, 1994

[30] Foreign Application Priority Data

Oct. 5, 1993 [JP] Japan ................... 5-248902
Mar. 4, 1994 [JP] Japan ................... 6-034752

[51] Int. Cl.$^6$ ................... C08K 3/20; H01B 1/02
[52] U.S. Cl. ................... 524/430; 524/434; 524/399; 524/556; 524/557; 524/564; 524/783; 524/784; 428/328; 428/483; 428/513; 252/511; 252/512; 252/518
[58] Field of Search ................... 524/430, 556, 524/557, 564, 783, 784, 434, 399; 252/518, 511, 512; 428/328, 483, 515

[56] References Cited

U.S. PATENT DOCUMENTS 5,204,177  4/1993  Sato et al. ................... 524/409
5,376,308  12/1994 Hirai et al. ................... 524/430

FOREIGN PATENT DOCUMENTS 62-004761  1/1987  Japan ................... 524/430
63-066267  3/1988  Japan ................... 524/430

*Primary Examiner*—Paul R. Michl
*Assistant Examiner*—Olga Asinovsky
*Attorney, Agent, or Firm*—Leydig, Voit & Mayer

[57] ABSTRACT

A composition for forming transparent conductive films comprises a tin-containing indium oxide (ITO) powder dispersed in a binder solution. The binder solution comprises a mixed organic solvent consisting of at least one polar solvent and at least one non-polar solvent, in which a polymer having a weight-average molecular weight of from 8,000 to 150,000 is dissolved. The polymer contains (a) an acidic functional group in such a proportion that the polymer has an acid number of from 0.5 to 15 mg-KOH/g, or (b) a polyalkylene glycol chain in a proportion of from 0.5% to 40% by weight, or both of (a) and (b) in the molecule. Alternatively, the binder solution comprises an actinic radiation-curable binder, which comprises an acrylate or methacrylate compound containing an acid phosphate group in the molecule. The composition can form, by coating, a transparent conductive film having improved electrical and optical properties.

25 Claims, No Drawings

COMPOSITION FOR FORMING CONDUCTIVE FILMS

BACKGROUND OF THE INVENTION

This invention relates to a composition for forming electrically conductive films which are based on an oxide semiconductor and are useful in various fields such as electrophotography, transparent electrodes, antistatic treatment, reflection of heat rays, and surface heat generator.

Transparent films of an oxide semiconductor generally have a high transmittance to visible light, a low electric resistivity, and a good film strength, and they are widely used as conductive films, e.g., as transparent electrodes in liquid crystal display devices, window materials in solar cells, heat ray-reflecting films, and antistatic films.

Typical of such an oxide semiconductor is an indium-tin oxide (abbreviated as ITO), which is a tin-containing indium oxide, or more specifically an indium oxide containing a minor amount of tin oxide.

Transparent conductive films have conventionally been formed by (1) a dry process in which a film of a metal or inorganic compound (particularly ITO or an analogous semiconductor metal oxide) is deposited onto an insulating substrate by means of vacuum deposition, sputtering, or ion plating, (2) a sol-gel process in which a solution of a decomposable metal compound is applied to a substrate and the resulting coating is dried and calcined to convert the compound into a metal oxide, or (3) a coating process in which a paint—or ink-like dispersion of an electrically conductive powder such as an ITO powder in a binder solution is applied to a substrate and dried or baked.

The dry process has been employed most widely in the formation of transparent conductive films. However, it is disadvantageous in that the deposition rate is low and only 40–55% of the feed material is effectively deposited in the formation of ITO films. The amount of unavailable material is further increased when part of the deposited film is removed by etching to form a circuit or other image. Moreover, the dry process requires complicated and expensive equipment.

The sol-gel and coating processes are both free from the above-described disadvantages. Thus, in these processes, large-size films can be formed with a high productivity using relatively simple equipment. Furthermore, an image such as a circuit can be directly formed by means of screen printing so that a substantial part of the feed material can be effectively used.

In the sol-gel process, however, the material for the substrate is limited, since the coating is finally calcined at a high temperature which is usually above 400° C. Therefore, a plastic substrate cannot be used in this process. In addition, the film thickness formed in a single application is so thin that application and subsequent drying steps should be repeated at least several times in order to obtain a film thick enough to exhibit adequate properties, which makes the procedure complicated.

On the other hand, the coating process can be applied to a plastic substrate since it does not involve a calcining step at a high temperature. It is also possible to obtain a film having a sufficient thickness by a single application. However, in order to form a transparent film by the coating process, it is necessary to use an ultrafine ITO powder having an average particle diameter of 0.5 μm or less and preferably 0.2 μm or less. Since such an ultrafine powder has a high tendency toward agglomeration, it is difficult to uniformly disperse the ITO powder in a binder solution. As a result, the resulting dispersion cannot form a transparent conductive film having desirable film properties. Thus, the ITO-containing conductive film formed from the dispersion has a resistivity which is not decreased sufficiently and it has a relatively high haze.

The dispersibility of an ultrafine ITO powder can be improved either by treating the powder with a dispersant before it is dispersed in a binder solution or by adding a dispersant to the binder solution. However, the use of a dispersant is difficult to decrease the resistivity of the resulting film to a desirable level. It is believed that dispersion of ITO particles with the aid of a dispersant causes the binder and the dispersant to be intimately adsorbed by the particles so as to form an insulating layer on the surface of each particle, thereby making it difficult to decrease the resistivity of an ITO powder-containing conductive film.

SUMMARY OF THE INVENTION

It is an object of this invention to provide a composition for forming conductive films which is capable of forming a transparent conductive film having improved electrical and optical properties, i.e., a sufficiently low resistivity and a high transmittance to visible light with a low haze, by the coating process using an ITO powder.

Another object of this invention is to provide a composition for forming conductive films which is capable of forming a transparent conductive film having, in addition to the above-described improved properties, a high hardness and a low susceptibility to scratches.

In one aspect, the present invention provides a composition for forming conductive films, which comprises a tin-containing indium oxide (ITO) powder dispersed in a binder solution. The binder solution comprises a mixed organic solvent consisting of at least one polar solvent and at least one non-polar solvent, in which a polymer having a weight-average molecular weight of from 8,000 to 150,000 is dissolved. The polymer contains (a) an acidic functional group in such a proportion that the polymer has an acid number of from 0.5 to 15 mg-KOH/g, or (b) a polyalkylene glycol chain in a proportion of from 0.5% to 40% by weight, or both (a) and (b) in the molecule.

In another aspect, the present invention provides an actinic radiation-curable composition for forming conductive films, which comprises a tin-containing indium oxide (ITO) powder dispersed in a binder solution. The binder solution comprises an actinic radiation-curable binder, which comprises an acrylate or methacrylate compound containing an acid phosphate group in the molecule.

Both the above-described compositions can form, by the coating process, a transparent conductive film having improved electrical and optical properties, i.e., a surface resistivity on the order of $10^2$–$10^5$ Ω/□ and preferably $10^2$–$10^3$ Ω/□, a transmittance to visible light of at least 80% and preferably at least 85%, and a haze of not greater than 6% and preferably not greater than 3%. Furthermore, a conductive film formed from the actinic radiation-curable composition has, in addition to the above-described properties, a high hardness and improved resistance to scratching.

DETAILED DESCRIPTION OF THE INVENTION

The ITO (tin-containing indium oxide) powder used in the present invention may be a commercially available product.

Alternatively, it may be prepared by a known method, such as by neutralizing an acidic solution containing a minor amount of tin chloride and a major amount of indium chloride with an alkali to cause co-precipitation of tin and indium hydroxides followed by calcination of the co-precipitates. The Sn content of the ITO powder is preferably from 1 to 15 at % (atomic percent) and more preferably from 2 to 10 at % based on the sum of (Sn+In) atoms, in view of electrical conductivity.

It is also preferable that the ITO powder be an ultrafine powder having an average (primary) particle diameter of 0.2 μm or less and more preferably 0.1 μm or less in order to ensure that the resulting film has good transparency. Due to Lord-Rayleigh scattering, the film transparency is lost when the ITO powder has an average particle diameter of greater than 0.2 μm. However, in those applications where the film transparency is of no significance, an ITO powder having an average particle diameter of greater than 0.2 μm may be used.

The ITO powder is dispersed in a binder solution so as to prepare a composition for forming a conductive film by the coating process.

In a first embodiment of the present invention, a polymer containing either an acidic functional group or a polyalkylene glycol chain or both is used as a binder and is dissolved in a mixed organic solvent consisting of at least one polar solvent and at least one non-polar solvent to form a binder solution, in which the ITO powder is dispersed.

Useful polar solvents include organic solvents having at least one hydroxyl and/or at least one ketone group, i.e., alcohol or ketone solvents, such as methanol, ethanol, butanol, diacetone alcohol, diethylene glycol, butylcarbitol, isophorone, and cyclohexanone.

Useful non-polar solvents include aromatic hydrocarbons such as toluene and xylene, alicyclic hydrocarbons such as cyclohexane, and aliphatic hydrocarbons such as hexane and octane.

The weight ratio of the polar to non-polar solvent in the mixed organic solvent is preferably in the range of from 0.5:9.5 to 7:3 and more preferably from 2:8 to 6:4.

The polar organic solvent has a high affinity for ITO powder and acts to preferentially solvate on the surface of the ITO powder, thereby interfering with adsorption of the binder polymer by the powder surface. The non-polar organic solvent has a low affinity for ITO powder and serves to weaken the above-described action of the polar solvent. Thus, the use of a mixed solvent of a polar solvent and a non-polar solvent makes it possible to control the amount of the binder polymer adsorbed by the ITO powder.

The polymer used as a binder in the first embodiment of the present invention has a weight-average molecular weight of from 8,000 to 150,000 and contains an acidic functional group and/or polyalkylene glycol chain in the molecule. The polymer species is not critical, but it is preferably selected from acrylic, alkyd, polyamide, polyester, and polycarbonate polymers. More preferably, the binder is an acrylic or polyester polymer.

The acidic functional group is preferably selected from carboxylic, phosphoric, and sulfonic acid groups. The proportion of the acidic functional group, when present in the polymer, is such that the polymer has an acid number of from 0.5 to 15 mg-KOH/g and preferably from 1.0 to 10 mg-KOH/g.

The polyalkylene glycol (or polyoxyalkylene) chain is preferably derived from polyethylene glycol, polypropylene glycol, polyethylene glycol alkylether, polyethylene glycol phenylether, polyethylene glycol alkylphenylether, polypropylene glycol alkylether, polypropylene glycol phenylether, polypropylene glycol alkylphenylether, polyethylene glycol alkylamine, polyethylene glycol alkylamide, and polyethylene glycol glycidylether. The proportion of the polyalkylene glycol chain, when present in the polymer, is in the range of from 0.5% to 40% and preferably from 2.0% to 30% by weight.

The polymer used as a binder in the first embodiment of the present invention can be prepared by a polymerization method known per se using a monomer containing an acidic functional group and/or a monomer containing a polyalkylene glycol chain as a reactant. In the case of an acrylic polymer, for example, useful monomers which contain an acidic functional group include unsaturated carboxylic acids such as acrylic acid, methacrylic acid, crotonic acid, 2-methacryloyloxyethylsuccinic acid, and 2-methacryloyloxyethylphthalic acid; (meth)acryloyl group-containing phosphate esters such as mono(2-(meth)acryloyloxyethyl) acid phosphate and diphenyl 2-(meth)acryloyloxyethyl phosphate; and 2-sulfoester (meth)acrylate. The expression "(meth)acryl" is intended to encompass both acryl and methacryl. Thus, (meth)acryloyl includes acryloyl and methacryloyl, and (meth)acrylate includes acrylate and methacrylate.

Both the binder polymers containing an acidic functional group and a polyalkylene glycol chain, respectively, exhibit a low level of electrical conductivity due to protonic or ionic conduction, thereby helping to decrease the film resistivity. Furthermore, they both possess in the molecule a hydrophilic group which can be adsorbed by an ITO powder, thereby facilitating deagglomeration of the ITO powder in the binder solution nearly into the individual primary particles and increasing the transparency of the resulting film.

Moreover, as described above, the amount of the binder polymer adsorbed by the ITO powder is controlled by use of the mixed solvent consisting of a polar and a non-polar solvent. A weak crosslinkage is formed between those areas of the surface of the ITO powder which are not covered by the adsorbed binder polymer, and it serves to prevent sedimentation of the ITO polymer, thereby enhancing the storage stability of the film-forming composition of the present invention. Since the weak crosslinkage can be readily broken, agitation of the composition before use causes the ITO powder to re-disperse in the binder solution even though the consistency of the composition is rather high, and the composition acts as a Newtonian fluid. Therefore, the composition is easy to coat or print to form conductive films.

When the proportion of a polar solvent in the mixed solvent is too high, the solvent has an excessive affinity for the ITO powder, which undesirably decreases the amount of the binder polymer adsorbed by the powder. As a result, the ITO powder cannot be dispersed sufficiently, thereby adversely affecting the storage stability of the composition and light transmittance of the resulting conductive film. On the other hand, when the proportion of a non-polar solvent is too high, the amount of the binder polymer adsorbed by the ITO powder is increased and the dispersibility of the powder is improved. However, the increased amount of the adsorbed binder polymer adversely affects the conductivity (low resistivity) of the resulting film.

When the binder polymer has a weight-average molecular weight of greater than 150,000 or its acid number is greater than 15 mg-KOH/g, the amount of adsorbed polymer is excessive. A polymer having a weight-average molecular weight of less than 8,000 serves as a dispersant and it is adsorbed intimately by the ITO powder, which excessively increases the amount of adsorbed polymer. As a result, the ITO powder is well-dispersed and the resulting film has a high light transmittance, but its electrical conductivity is decreased.

When the acid number of the binder polymer is less than 0.5 mg-KOH/g, the polymer is not adsorbed sufficiently by the ITO powder, thereby adversely affecting the dispersibility of the powder. The dispersibility of the ITO powder is also degraded when the content of polyalkylene glycol chain in the polymer is more than 40% or less than 0.5% by weight. As a result, the composition has a decreased storage stability and the resulting film has a decreased light transmittance and an increased haze.

The composition for forming conductive films according to the first embodiment of the present invention can be prepared by dispersing an ITO powder in a binder solution, which is a solution of the above-described polymer in the above-described mixed organic solvent, by a conventional mixing means such as a paint shaker, ball mill, sand mill, or triple roll mill. The composition can be applied as a paint or ink to an appropriate substrate by coating or printing and then heated, if necessary, to dry and/or cure the wet film, resulting in the formation of a transparent conductive film.

The composition may further comprise one or more optional additives such as a curing catalyst, curing agent, wetting agent, dispersant, antioxidant, or leveling agent, in addition to the mixed organic solvent, polymer, and ITO powder.

The nonvolatile content of the binder solution is selected such that the resulting ITO-dispersed composition has a consistency suitable for application by coating or printing.

The weight ratio of ITO powder to binder polymer is preferably in the range of from 60:40 to 90:10 and more preferably from 65:35 to 86:14. When the proportion of ITO powder is too low, the resulting film cannot exhibit the desired level of conductivity. When it is too high, film properties such as transparency and adhesion to the substrate tend to deteriorate.

The composition according to the first embodiment can generally form a transparent conductive film having a surface resistivity on the order of $10^2$–$10^4$ $\Omega/\square$ and a light transmittance in the range of 80%–90%. More specifically, when the polymer contains an acidic functional group but is free from a polyalkylene glycol chain, the resulting film generally has a surface resistivity on the order of $10^3$ or $10^4$ $\Omega/\square$ and a light transmittance of at least 85%. When the polymer contains a polyalkylene glycol chain but is free from an acidic functional group, the resulting film generally has a surface resistivity on the order of $10^2$ $\Omega/\square$ and a light transmittance of at least 80%. Thus, the latter film is superior to the former film in resistivity but inferior thereto in light transmittance. When the polymer has an acid number in the range of 0.5–15 mg-KOH/g and a content of polyalkylene glycol chain in the range of 0.5–40%, the resulting film is improved both in resistivity and transparency, that is, it has a surface resistivity on the order of $10^2$ $\Omega/\square$ and a light transmittance of at least 85%. Therefore, the resistivity and transparency of a film can be adjusted according to the acid number and the content of polyalkylene glycol chain of the polymer.

In a second embodiment of the present invention, an actinic radiation-curable binder which comprises an acrylate or methacrylate compound containing an acid phosphate group is used to form a binder solution, in which an ITO powder is dispersed to form an actinic radiation-curable composition for forming conductive films. As described above, the term "(meth)acrylate" encompasses "acrylate" and "methacrylate".

The actinic radiation-curable binder comprises the acid phosphate group-containing (meth)acrylate compound and optionally one or more other radically polymerizable monomers and/or oligomers.

Examples of the acid phosphate group-containing (meth)acrylate compound are those compounds having the following general formula (I) or (II):

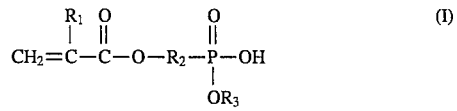

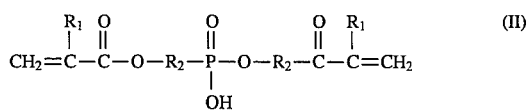

wherein $R_1$ is hydrogen or methyl, $R_2$ is an alkyleneoxy or polyalkyleneoxy group, and $R_3$ is hydrogen, phenyl, an alkyl or alkylphenyl group.

Specific examples of a compound of Formula (I) include mono(2-(meth)acryloyloxyethyl) acid phosphate, mono(ω-(meth)acryloylpolyoxyethyl) acid phosphate, mono(2-(meth)acryloyloxyethyl) methyl acid phosphate, and mono(2-(meth)acryloyloxyethyl) phenyl acid phosphate.

Specific examples of a compound of Formula (II) include di(2-(meth)acryloyloxyethyl) acid phosphate and di(ω-(meth)acryloylpolyoxyethyl) acid phosphate.

Radically polymerizable monomers, which may optionally comprise the binder along with the acid phosphate group-containing (meth)acrylate compound, are compounds having one or more α,β-ethylenically unsaturated groups. Such monomers may contain an acidic functional group other than acid phosphate group, e.g., a carboxyl or sulfonyl group, a basic functional group such as an amino group, and/or a neutral functional group such as a hydroxyl group in the molecule.

Examples of useful radically polymerizable monomers include vinyl monomers other than (meth)acrylate esters, such as styrene, vinyltoluene, vinyl acetate, N-vinylpyrrolidone, (meth)acrylonitrile, allyl alcohol, (meth)acrylic acid, and itaconic acid; monofunctional (meth)acrylates such as methyl (meth)acrylate, ethyl (meth)acrylate, isopropyl (meth)acrylate, 2-ethylhexyl (meth)acrylate, butyl (meth) acrylate, cyclohexyl (meth)acrylate, tetrahydrofurfuryl (meth)acrylate, 2-hydroxyethyl (meth)acrylate, 2-hydroxypropyl (meth)acrylate, polyethylene glycol mono(meth)acrylate, methoxypolyethylene glycol mono(meth)acrylate, polypropylene glycol mono(meth)acrylate, polyethylene glycol-polypropylene glycol mono(meth)acrylate, polyethylene glycol-polytetramethylene glycol mono(meth)acrylate, and glycidyl (meth)acrylate; difunctional (meth)acrylates such as ethylene glycol di(meth)acrylate, diethylene glycol di(meth)acrylate, triethylene glycol di(meth)acrylate, tetraethylene glycol di(meth)acrylate, polyethylene glycol di(meth)acrylate, polypropylene glycol di(meth)acrylate, neopentyl glycol di(meth)acrylate, allyl (meth)acrylate, bisphenol A di(meth)acrylate, ethylene oxide-modified bisphenol A di(meth)acrylate, polyethylene oxide-modified bisphenol A di(meth)acrylate, ethylene oxide-modified bisphenol S di(meth)acrylate, bisphenol S di(meth)acrylate, 1,4-butanediol di(meth)acrylate, and 1,3-butylene glycol di(meth)acrylate; and tri- and higher-functional (meth)acrylates such as trimethylolpropane tri(meth)acrylate, glycerol tri(meth)acrylate, pentaerythritol tri(meth)acrylate, pentaerythritol tetra(meth)acrylate, ethylene-modified trimethylolpropane tri(meth)acrylate, and dipentaerythritol hexa(meth)acrylate.

Examples of useful radically polymerizable oligomers are prepolymers having at least one (meth)acryloyl group, such as polyester (meth)acrylates, polyurethane (meth)acrylates, epoxy(meth)acrylates, polyether (meth)acrylates, oligo(meth)acrylates, alkyd (meth)acrylates, polyol (meth)acrylates, and silicone (meth)acrylates. Particularly preferred radically polymerizable oligomers are polyester (meth)acrylates, epoxy (meth)acrylates, and polyurethane (meth)acrylates.

In order to form a cured film having improved transparency and electrical conductivity, it is preferred that the acid phosphate group-containing (meth)acrylate compound be present in a proportion of at least 2% by weight based on the total weight of the binder. Although the binder may be comprised solely of the acid phosphate group-containing compound, it is desirable that the compound comprise not greater than 50% by weight based on the total weight of the binder in view of some properties of the cured film such as water resistance. The remainder of the binder is comprised of one or more radically polymerizable monomers and/or oligomers as exemplified above.

Preferably, the binder as a whole has an acid number in the range of from 1 to 300 mg-KOH/g and more preferably from 5 to 200 mg-KOH/g. When the binder comprises a monomer or oligomer containing an acidic functional group other than an acid phosphate group, e.g., (meth)acrylic acid, such a monomer or oligomer also contributes to the acid number. If the acid number of the binder is less than 1 mg-KOH/g, the ITO powder may not be well dispersed, resulting in a decrease in light transmittance of the film. If it is more than 300 mg-KOH/g, some properties of the cured film such as water resistance may be deteriorated.

Also in the actinic radiation-curable composition according to the second embodiment of the present invention, the weight ratio of ITO powder to binder is preferably in the range of from 60:40 to 90:10 and more preferably from 65:35 to 86:14.

It is desirable that the actinic radiation-curable composition contain a minor amount of a photoinitiator, which makes it possible to cure the composition by irradiation with a decreased dose of actinic radiation. Examples of useful photoinitiators include 1-hydroxycyclohexyl phenyl ketone, benzophenone, benzyl-dimethylketal, benzoin methyl ether, benzoin ethyl ether, p-chlorobenzophenone, 4-benzoyl-4-methyldiphenyl sulfide, 2-benzyl-2-dimethylamino-1-(4-morpholino-phenyl)butanone-1, and 2-methyl-1-[4-(methylthio)phenyl]-2-morpholinopropanone-1. One or more photoinitiators may be added to the composition in a total proportion of from 0.1 to 20 parts and preferably from 1.0 to 15.0 parts by weight for each 100 parts of the binder.

It is also possible to cure the composition by heating. In such cases, an appropriate radical polymerization initiator, e.g., azobisisobutyronitrile, may be added in place of a photoinitiator.

The composition according to the second embodiment of the invention can be prepared by dispersing an ITO powder in a binder solution, which is the above-described binder diluted, if necessary, with an organic solvent, by a conventional mixing means as described above.

It is preferable that the organic solvent, if used, have good compatibility with the binder. Useful organic solvents include ketones such as methyl ethyl ketone, methyl isobutyl ketone, isophorone, and acetylacetone, alcohols such as ethanol, 1-butanol, and 2-propanol, cellosolves, acetate esters, ethers, and aromatic hydrocarbons such as toluene and xylene. One or more solvents may be used. The organic solvent is used in such an amount that the composition containing an ITO powder dispersed in the binder solution has a consistency suitable for coating or printing. The viscosity of the composition is preferably in the range of 2–5,000 cps as measured by an E-type viscometer.

The composition according to the second embodiment may further contain one or more additives such as a polymerization inhibitor, curing catalyst, antioxidant, leveling agent, and thermoplastic resin for dilution.

The composition is applied to an appropriate substrate by coating or printing followed by heating, if necessary, to evaporate the solvent. Subsequently, the substrate is irradiated with actinic radiation (UV light or an electron beam) to cure the film and form a transparent conductive film on the substrate. The source of actinic radiation may be selected from a low-pressure mercury lamp, high-pressure mercury lamp, metal halide lamp, xenon lamp, excimer laser, and dye laser for UV light, and an electron beam accelerator. The dose is usually in the range of 50–3,000 mJ/cm$^2$ for UV light and in the range of 0.2–1,000 μC/cm$^2$ for electron beams.

The composition according to the second embodiment can generally form a transparent conductive film having a surface resistivity on the order of $10^3$–$10^5$ Ω/□ and a light transmittance in the range of 85%–90%.

The coating or printing of a substrate with a composition according to the first or second embodiment of the present invention may be performed by a conventional method such as roll coating, spin coating, or screen printing. The substrate may be made of any insulating material including synthetic polymers, glasses, and ceramics, and it has any appropriate shape such as a film, sheet, or panel. Examples of synthetic polymers suitable as a material for substrates include a polyethylene, polypropylene, polycarbonate, acrylic polymer, methacrylic polymer, polyvinyl chloride, polyester, polyamide, epoxide, and phenol resin. The film thickness of the resulting dried or cured transparent conductive film is usually in the range of from 0.5 to 5.0 μm.

The transparent conductive films formed from the composition of the present invention are useful as dust-preventing layers in electrophotography, transparent electrodes in liquid crystal display devices, antistatic layers, IR reflecting layers, surface heat generators, touch panels, and window materials in solar cells.

The following examples are presented to further illustrate the present invention. These examples are to be considered in all respects as illustrative and not restrictive. In the examples, all parts are by weight unless otherwise indicated.

In all the examples, an ITO powder containing 5 at % of Sn based on the sum of (In+Sn) atoms and having an average primary particle diameter of 0.05 μm was used.

EXAMPLE 1

To a flask fitted with a reflux condenser, thermometer, dropping funnel, and stirrer, 60 parts of xylene were added and heated to 90° C. Subsequently, a mixture of 20 parts of styrene, 19.5 parts of methyl acrylate, 0.5 parts of acrylic acid, and 2 parts of azobisisobutyronitrile was added to the flask over 4 hours and then allowed to react for 10 hours while stirring and heating were continued. The reaction product was a polymer solution having a nonvolatile content of 41 wt % in which the polymer had a weight-average molecular weight of 10,000 and an acid number of 9.7 mg-KOH/g.

50.0 parts of the polymer solution, 80.0 parts of an ITO powder, 120.0 parts of a mixed butanol-xylene solvent (butanol/xylene weight ratio=4/6), and 250.0 parts of glass beads were added to a vessel and ground for 5 hours on a paint shaker while the degree of dispersion was examined with a grind gauge. After grinding, the glass beads were removed to give a viscous liquid, which was a dispersion of the ITO powder uniformly distributed in a polymeric binder solution.

A PET (polyethylene terephthalate) film was coated with the viscous liquid obtained above using an applicator and dried and cured for 1 hour at 100° C., thereby forming a 2 μm-thick transparent film on the PET film.

EXAMPLE 2

Following the procedure described in Example 1, a polymer solution having a nonvolatile content of 40 wt % was prepared from 60 parts of xylene, 20 parts of styrene, 19.95 parts of methyl acrylate, 0.05 parts of acrylic acid, and 0.6 parts of azobisisobutyronitrile, and an ITO-containing transparent film was formed from the polymer solution.

EXAMPLE 3

Following the procedure described in Example 1, a polymer solution having a nonvolatile content of 41 wt % was prepared from 60 parts of xylene, 20 parts of styrene, 19.2 parts of methyl acrylate, 0.8 parts of mono(2-methacryloyloxyethyl) acid phosphate, and 1.0 part of azobisisobutyronitrile, and an ITO-containing transparent film was formed from the polymer solution.

EXAMPLE 4

Following the procedure described in Example 1, 30.0 parts of a polyester resin solution having a nonvolatile content of 60 wt %, 80.0 parts of an ITO powder, and 140.0 parts of a mixed butanol-xylene solvent (butanol/xylene weight ratio=4/6) were ground, and the resulting dispersion in viscous liquid was applied onto a PET film to form a 2 μm-thick transparent film.

The polyester resin solution used in this example was prepared by dissolving a polyester resin having a weight-average molecular weight of 65,000 and an acid number of 7 mg-KOH/g in a mixed butanol-xylene solvent (butanol/xylene weight ratio=2/8).

COMPARATIVE EXAMPLE 1

Following the procedure described in Example 1, a polymer solution having a nonvolatile content of 42 wt % was prepared from 60 parts of xylene, 20 parts of styrene, 19.5 parts of methyl acrylate, 0.5 parts of acrylic acid, and 3 parts of azobisisobutyronitrile, and an ITO-containing transparent film was formed from the polymer solution.

COMPARATIVE EXAMPLE 2

Following the procedure described in Example 1, a polymer solution having a nonvolatile content of 40 wt % was prepared from 60 parts of xylene, 20 parts of styrene, 17.00 parts of methyl acrylate, 1.00 parts of acrylic acid, and 2.00 parts of azobisisobutyronitrile, and an ITO-containing transparent film was formed from the polymer solution.

COMPARATIVE EXAMPLE 3

Following the procedure described in Example 1, a polymer solution having a nonvolatile content of 40 wt % was prepared from 60 parts of xylene, 20 parts of styrene, 19.2 parts of methyl acrylate, 0.8 parts of mono(2-methacryloyloxyethyl) acid phosphate, and 0.3 parts of azobisisobutyronitrile, and an ITO-containing transparent film was formed from the polymer solution.

COMPARATIVE EXAMPLE 4

Following the procedure described in Example 4 except that the polyester resin solution had a nonvolatile content of 40 wt % and that the polyester resin had a weight-average molecular weight of 49,000 and an acid number of 0.3 mg-KOH/g, an ITO powder-containing viscous liquid was prepared and applied to a PET film to form a 2 μm-thick transparent film.

EXAMPLE 5

Following the procedure described in Example 1, a polymer solution having a nonvolatile content of 41 wt % was prepared from 60 parts of xylene, 20 parts of styrene, 19.0 parts of methyl acrylate, 1.0 part of methoxypolyethylene glycol methacrylate (MW = 496), and 2.0 parts of azobisisobutyronitrile, and it was used to form a 2 μm-thick transparent film containing ITO powder on a PET film. The polymer formed in this example contained 2.0 wt % of a polyalkylene glycol chain and had a weight-average molecular weight of 10,000.

EXAMPLE 6

Following the procedure described in Example 1, a polymer solution having a nonvolatile content of 40 wt % was prepared from 60 parts of xylene, 20 parts of styrene, 19.0 parts of methyl acrylate, 1.0 part of methoxypolyethylene glycol methacrylate, and 0.6 parts of azobisisobutyronitrile, and it was used to form an ITO-containing transparent film.

EXAMPLE 7

Following the procedure described in Example 1, a polymer solution having a nonvolatile content of 40 wt % was prepared from 60 parts of xylene, 20 parts of styrene, 5.0 parts of methyl acrylate, 15 parts of methoxypolyethylene glycol methacrylate, and 0.6 parts of azobisisobutyronitrile, and it was used to form an ITO-containing transparent film.

COMPARATIVE EXAMPLE 5

Following the procedure described in Example 1, a polymer solution having a nonvolatile content of 42 wt % was prepared from 60 parts of xylene, 20 parts of styrene, 19.0 parts of methyl acrylate, 1.0 part of methoxypolyethylene glycol methacrylate, and 3 parts of azobisisobutyronitrile, and it was used to form an ITO-containing transparent film.

COMPARATIVE EXAMPLE 6

Following the procedure described in Example 1, a polymer solution having a nonvolatile content of 40 wt % was prepared from 60 parts of xylene, 20 parts of styrene, 19.0 parts of methyl acrylate, 1.0 part of methoxypolyethylene glycol methacrylate, and 0.3 parts of azobisisobutyronitrile, and it was used to form an ITO-containing transparent film.

COMPARATIVE EXAMPLE 7

Following the procedure described in Example 1, a polymer solution having a nonvolatile content of 42 wt % was prepared from 60 parts of xylene, 20 parts of styrene, 20 parts of methyl acrylate, and 0.6 parts of azobisisobutyronitrile, and it was used to form an ITO-containing transparent film.

COMPARATIVE EXAMPLE 8

Following the procedure described in Example 1, a polymer solution having a nonvolatile content of 40 wt % was prepared from 60 parts of xylene, 10 parts of styrene, 10 parts of methyl acrylate, 20 parts of polyethylene glycol monomethacrylate, and 0.6 parts of azobisisobutyronitrile, and it was used to form an ITO-containing transparent film.

COMPARATIVE EXAMPLE 9

Following the procedure described in Example 5 except that the mixed solvent used in the grinding step was replaced by xylene alone, a polymer solution was prepared and used to form an ITO-containing transparent film.

COMPARATIVE EXAMPLE 10

Following the procedure described in Example 5 except that the mixed solvent used in the grinding step was replaced by butanol alone, a polymer solution was prepared and used to form an ITO-containing transparent film.

EXAMPLE 8

Following the procedure described in Example 1, a polymer solution having a nonvolatile content of 44 wt % was prepared from 60 parts of xylene, 14.5 parts of styrene, 10.0 parts of methyl acrylate, 0.5 parts of acrylic acid, 15 parts of methoxypolyethylene glycol methacrylate, and 2.0 parts of azobisisobutyronitrile, and it was used to form a 2 μm-thick, ITO powder-containing transparent film on a PET film. The polymer formed in this example contained 30 wt % of a polyalkylene glycol chain and had a weight-average molecular weight of 10,000 and an acid number of 9.7 mg-KOH/g.

EXAMPLE 9

Following the procedure described in Example 1, a polymer solution having a nonvolatile content of 40 wt % was prepared from 60 parts of xylene, 14.95 parts of styrene, 10.0 parts of methyl acrylate, 0.05 parts of acrylic acid, 15 parts of methoxypolyethylene glycol methacrylate, and 0.6 parts of azobisisobutyronitrile, and it was used to form an ITO-containing transparent film.

EXAMPLE 10

Following the procedure described in Example 1, a polymer solution having a nonvolatile content of 40 wt % was prepared from 60 parts of xylene, 20 parts of styrene, 18.95 parts of methyl acrylate, 0.05 parts of acrylic acid, 1.0 part of polyethylene glycol methacrylate, and 0.6 parts of azobisisobutyronitrile, and it was used to form an ITO-containing transparent film.

EXAMPLE 11

Following the procedure described in Example 1, 30 parts of a polyester resin solution having a nonvolatile content of 60 wt %, 80.0 parts of an ITO powder, and 140.0 parts of a mixed butanol-xylene solvent (butanol/xylene weight ratio= 4/6) were ground, and the resulting dispersion in viscous liquid was applied onto a PET film to form a 2 μm-thick transparent film.

The polyester resin solution used in this example was prepared by dissolving in a mixed butanol-xylene solvent (butanol/xylene weight ratio=2/8) a polyester resin having a weight-average molecular weight of 30,000 and an acid number of 5 mg-KOH/g and containing 5 wt % of a polyethylene glycol chain.

COMPARATIVE EXAMPLE 11

Following the procedure described in Example 1, a polymer solution having a nonvolatile content of 42 wt % was prepared from 60 parts of xylene, 14.5 parts of styrene, 10.0 parts of methyl acrylate, 0.5 parts of acrylic acid, 15 parts of methoxypolyethylene glycol methacrylate, and 3.0 parts of azobisisobutyronitrile, and it was used to form an ITO-containing transparent film.

COMPARATIVE EXAMPLE 12

Following the procedure described in Example 1, a polymer solution having a nonvolatile content of 41 wt % was prepared from 60 parts of xylene, 14.5 parts of styrene, 10 parts of methyl acrylate, 0.5 parts of acrylic acid, 15 parts of methoxypolyethylene glycol methacrylate, and 0.3 parts of azobisisobutyronitrile, and it was used to form an ITO-containing transparent film.

COMPARATIVE EXAMPLE 13

Following the procedure described in Example 1, a polymer solution having a nonvolatile content of 41 wt % was prepared from 60 parts of xylene, 9.00 parts of styrene, 10 parts of methyl acrylate, 1.00 part of acrylic acid, 20 parts of methoxypolyethylene glycol methacrylate, and 2.0 parts of azobisisobutyronitrile, and it was used to form an ITO-containing transparent film.

The following Table 1 shows the weight-average molecular weight (Mw), acid number, and polyalkylene glycol chain content of the polymer prepared or used in each example.

The ITO powder-containing transparent film obtained in each example was tested for overall light transmittance in the visible wavelength region (measured by a spectrophotometer manufactured by Nippon Bunko, model UBEST 55), haze (measured by Color Computer SM manufactured by Suga Shikenki), and surface resistivity (measured using a surface resistivity tester by Mitsubishi Yuka, model AP MCP-T400). The test results are also shown in Table 1.

The ITO-powder containing viscous liquids obtained in Examples 1 to 11 were allowed to stand for one month at room temperature and then agitated by a mixer sold under the tradename "Disper". All the tested liquids were readily restored to their original dispersion state in which the ITO powder was uniformly distributed in the polymer solution.

TABLE 1

| Example No. | Binder Polymer | | | Solvent | Film Properties | | |
|---|---|---|---|---|---|---|---|
| | Weight-average molecul. weight | Acid number (mg-KOH/g) | PAG[1] chain cont. (wt %) | Polar/Non-polar weight ratio | Surface resistivity ($\Omega/\square$) | Overall light transmittance (%) | Haze (%) |
| Example | | | | | | | |
| 1 | 10,000 | 9.7 | — | 3.2/6.8 | $9 \times 10^3$ | 85 | 4 |
| 2 | 100,000 | 1.0 | — | 3.2/6.8 | $5 \times 10^3$ | 87 | 2 |
| 3 | 50,000 | 5.6 | — | 3.2/6.8 | $6 \times 10^3$ | 86 | 3 |
| 4 | 65,000 | 7.0 | — | 3.8/6.2 | $9 \times 10^3$ | 85 | 4 |
| Comparative Example | | | | | | | |
| 1 | 5,000* | 9.7 | — | 3.2/6.8 | $5 \times 10^7$ | 87 | 2 |
| 2 | 10,000 | 20.0* | — | 3.2/6.8 | $7 \times 10^7$ | 79 | 8 |
| 3 | 200,000* | 5.6 | — | 3.2/6.8 | $5 \times 10^7$ | 78 | 10 |
| 4 | 49,000 | 0.3* | — | 3.8/6.2 | $9 \times 10^7$ | 55 | 29 |
| Example | | | | | | | |
| 5 | 10,000 | — | 2.0 | 3.2/6.8 | $8 \times 10^2$ | 81 | 6 |
| 6 | 100,000 | — | 2.0 | 3.2/6.8 | $5 \times 10^2$ | 83 | 4 |
| 7 | 100,000 | — | 30 | 3.2/6.8 | $6 \times 10^2$ | 82 | 5 |
| Comparative Example | | | | | | | |

TABLE 1-continued

| Example No. | Binder Polymer | | | Solvent | Film Properties | | |
|---|---|---|---|---|---|---|---|
| | Weight-average molecul. weight | Acid number (mg-KOH/g) | PAG[1] chain cont. (wt %) | Polar/Non-polar weight ratio | Surface resistivity ($\Omega/\square$) | Overall light transmittance (%) | Haze (%) |
| 5 | 5,000* | — | 2.0 | 3.2/6.8 | $2 \times 10^7$ | 83 | 4 |
| 6 | 200,000* | — | 2.0 | 3.2/6.8 | $3 \times 10^6$ | 68 | 20 |
| 7 | 100,000 | — | 0* | 3.2/6.8 | $5 \times 10^7$ | 20 | 70 |
| 8 | 100,000 | — | 50* | 3.2/6.8 | $1 \times 10^7$ | 70 | 14 |
| 9 | 10,000 | — | 2.0 | xylene * | $8 \times 10^7$ | 83 | 4 |
| 10 | 10,000 | — | 2.0 | butanol * | $9 \times 10^4$ | 68 | 14 |
| Example | | | | | | | |
| 8 | 10,000 | 9.7 | 30 | 3.2/6.8 | $9 \times 10^2$ | 87 | 2 |
| 9 | 100,000 | 1.0 | 30 | 3.2/6.8 | $7 \times 10^2$ | 85 | 3 |
| 10 | 100,000 | 1.0 | 2.0 | 3.2/6.8 | $6 \times 10^2$ | 86 | 3 |
| 11 | 30,000 | 5 | 5 | 3.2/6.8 | $9 \times 10^2$ | 86 | 3 |
| Comparative Example | | | | | | | |
| 11 | 5,000* | 9.7 | 30 | 3.2/6.8 | $2 \times 10^7$ | 88 | 2 |
| 12 | 200,000* | 9.7 | 30 | 3.2/6.8 | $1 \times 10^7$ | 80 | 7 |
| 13 | 10,000 | 20.0* | 50* | 3.2/6.8 | $3 \times 10^7$ | 77 | 10 |

[1]PAG = Polyalkylene glycol; * Outside the range of this invention

As can be seen from Table 1, a conductive film having a low resistivity and high transparency, i.e., a surface resistivity on the order of $10^2$–$10^4$ $\Omega/\square$, a light transmittance of at least 80%, and a haze of not greater than 6% could be formed from a composition according to the first embodiment of the present invention, which comprised an ITO powder dispersed in a binder solution in which the solvent was a mixed organic solvent of a polar and a non-polar solvent and the binder polymer had a weight-average molecular weight of 8,000–150,000, and either an acid number of 0.5–15 mg-KOH/g or a polyalkylene glycol content of 0.5–40 wt % or both. In particular, when the polymer had an acid number of 0.5–15 mgKOH/g and a polyalkylene glycol content of 0.5–40 wt %, the resulting film had further improved properties, i.e., a surface resistivity on the order of $10^2$ $\Omega/\square$, a light transmittance of at least 85%, and a haze of not greater than 3%. The composition according to the present invention had good stability during storage.

In contrast, at least one of the above-described properties (conductivity or low resistivity, light transmittance, and haze) was deteriorated in each comparative example.

The following examples illustrate the second embodiment of the present invention using an actinic radiation-curable binder which comprises an acid phosphate group-containing (meth)acrylate compound.

EXAMPLE 12

A binder consisting of 1.4 parts of mono(2-methacryloylpolyoxyethyl) acid phosphate (Phosmer PE manufactured by Uni-Chemical, containing 4–5 moles of polyethylene oxide per molecule) as an acid phosphate group-containing methacrylate compound, 13.6 parts of diethylene glycol dimethacrylate, 5 parts of trimethylolpropane triacrylate, and 10 parts of a polyester acrylate oligomer was added to a vessel along with 70 parts of an ITO powder, 150 parts of a mixed butanol-xylene solvent (butanol/xylene weight ratio=4/6), and 250 parts of glass beads and the mixture was ground for 5 hours on a paint shaker while the degree of dispersion was examined with a grind gauge. After grinding, 3 parts of 2-benzyl-2-dimethylamino-1-(4-morpholinophenyl)butanone-1 as a photoinitiator were added to the resulting dispersion and completely dissolved therein. The glass beads were then removed to give a viscous liquid, which was a dispersion of the ITO powder uniformly distributed in a binder solution.

A glass plate was coated with the viscous liquid obtained above using an applicator, and after evaporation of the organic solvent, it was irradiated with UV radiation at a dose of 500 mJ/cm² using a high-pressure mercury lamp, thereby forming a 2 µm-thick transparent cured film.

EXAMPLE 13

An ITO powder-containing transparent cured film was formed in the same manner as described in Example 12 except that the materials used were 7.5 parts of the acid phosphate group-containing methacrylate compound, 7.5 parts of diethylene glycol dimethacrylate, 5 parts of trimethylolpropane triacrylate, 10 parts of a polyester acrylate oligomer, 70 parts of an ITO powder, and 150 parts of the mixed organic solvent.

EXAMPLE 14

An ITO powder-containing transparent cured film was formed in the same manner as described in Example 12 except that the materials used were 14 parts of the acid phosphate group-containing methacrylate compound, 1.0 part of diethylene glycol dimethacrylate, 5 parts of trimethylolpropane triacrylate, 10 parts of a polyester acrylate oligomer, 70 parts of an ITO powder, and 150 parts of the mixed organic solvent.

EXAMPLE 15

An ITO powder-containing transparent cured film was formed in the same manner as described in Example 12 except that the materials used were 1.4 parts of the acid phosphate group-containing methacrylate compound, 2.5 parts of acrylic acid, 11.1 parts of diethylene glycol dimethacrylate, 5 parts of trimethylolpropane triacrylate, 10 parts of a polyester acrylate oligomer, 70 parts of an ITO powder, and 150 parts of the mixed organic solvent.

EXAMPLE 16

A binder consisting of 12.6 parts of di(2-methacryloyloxyethyl) acid phosphate (MR-200 manufactured by Daihachi Kagaku Kogyo) as an acid phosphate group-containing methacrylate compound, 2.4 parts of diethylene glycol dimethacrylate, 5 parts of trimethylolpropane triacrylate, and 10 parts of a polyester acrylate oligomer were added to a vessel along with 70 parts of an ITO powder, 150 parts of the same mixed organic solvent as used in Example 12, and 250 parts of glass beads, and the mixture was ground for 5 hours on a paint shaker while the degree of dispersion was examined with a grind gauge.

Thereafter, following the procedure described in Example 12, a photoinitiator was added, glass beads were removed, and the resulting dispersion was used to form a 2 μm-thick transparent cured film on a glass plate.

EXAMPLE 17

An ITO powder-containing transparent cured film was formed in the same manner as described in Example 12 except that the materials used were 7.5 parts of the acid phosphate group-containing methacrylate compound, 2.0 parts of trimethylolpropane triacrylate, 5.5 parts of a polyester acrylate oligomer, 85 parts of an ITO powder, and 150 parts of the mixed organic solvent.

EXAMPLE 18

An ITO powder-containing transparent cured film was formed in the same manner as described in Example 12 except that the materials used were 7.5 parts of the acid phosphate group-containing methacrylate compound, 7.5 parts of a polyurethane acrylate oligomer, 85 parts of an ITO powder, and 150 parts of the mixed organic solvent.

COMPARATIVE EXAMPLE 14

An ITO powder-containing transparent cured film was formed in the same manner as described in Example 12 except that the materials used were 3 parts of acrylic acid, 12.0 parts of diethylene glycol dimethacrylate, 5 parts of trimethylolpropane triacrylate, 10 parts of a polyester acrylate oligomer, 70 parts of an ITO powder, and 150 parts of the mixed organic solvent.

COMPARATIVE EXAMPLE 15

An ITO powder-containing transparent cured film was formed in the same manner as described in Example 12 except that the materials used were 10 parts of 2-hydroxyethyl methacrylate, 5.0 parts of diethylene glycol dimethacrylate, 5.0 parts of trimethylolpropane triacrylate, 10.0 parts of a polyester acrylate oligomer, 70 parts of an ITO powder, and 150 parts of the mixed organic solvent.

COMPARATIVE EXAMPLE 16

This example illustrates the use of a methacrylate compound containing a neutral phosphate group rather than an acid phosphate group.

An ITO powder-containing transparent cured film was formed in the same manner as described in Example 12 except that the materials used were 7.5 parts of diphenyl 2-methacryloyloxyethyl phosphate (MR-260 manufactured by Daihachi Kagaku Kogyo) as a neutral phosphate group-containing methacrylate compound, 7.5 parts of diethylene glycol dimethacrylate, 5 parts of trimethylolpropane triacrylate, 10 parts of a polyester acrylate oligomer, 70 parts of an ITO powder, and 150 parts of the same mixed organic solvent.

The acid numbers of the binders used in Examples 12 to 18 and Comparative Examples 14 to 16 are shown in Table 2 along with the test results (overall light transmittance in the visible region, haze, surface resistivity, and pencil hardness according to JIS C3003) of the resulting transparent cured film.

TABLE 2

| | Binder | | | Film Properties | | | |
| --- | --- | --- | --- | --- | --- | --- | --- |
| Example No. | Presence of acid phosphate group | Acid number (mg-KOH/g) | ITO/ binder weight ratio | Surface resistivity (Ω/□) | Overall light transmittance (%) | Haze (%) | Pencil Hardness |
| Example | | | | | | | |
| 12 | Yes | 15 | 70/30 | $9 \times 10^3$ | 86 | 1.5 | 5H |
| 13 | Yes | 80 | 70/30 | $8 \times 10^3$ | 88 | 1.1 | 7H |
| 14 | Yes | 150 | 70/30 | $4 \times 10^4$ | 88 | 1.2 | 6H |
| 15 | Yes | 80 | 70/30 | $2 \times 10^5$ | 85 | 1.8 | 5H |
| 16 | Yes | 80 | 70/30 | $6 \times 10^4$ | 86 | 1.5 | 5H |
| 17 | Yes | 80 | 85/15 | $5 \times 10^3$ | 87 | 1.2 | 7H |
| 18 | Yes | 80 | 85/15 | $6 \times 10^3$ | 87 | 1.1 | 9H |
| Comparative Example | | | | | | | |
| 14 | No | 80 | 70/30 | $9 \times 10^7$ | 68 | 29 | H |
| 15 | No | 0 | 70/30 | $2 \times 10^8$ | 63 | 38 | HB |
| 16 | No | 0 | 70/30 | $5 \times 10^8$ | 60 | 32 | HB |

As can be seen from Table 2, a conductive film having a low resistivity, high transparency, high resistance to scratching, i.e., a surface resistivity on the order of $10^3$–$10^6$ Ω/□, a light transmittance of at least 85%, a haze of greater than 2%, and a pencil hardness of 5 H–9 H could be formed from a radically polymerizable composition according to the second embodiment of the present invention, which comprised an ITO powder dispersed in a binder solution in which the binder contained an acid phosphate group-containing (meth)acrylate compound.

In contrast, at least one of the above-described properties was deteriorated in each comparative example.

What is claimed is:

1. A composition for forming a conductive film, which comprises a tin-containing indium oxide powder dispersed in a binder solution, wherein the binder solution comprises a binder polymer having a weight-average molecular weight of from 8,000 to 150,000 dissolved in a mixed organic solvent of at least one polar solvent and at least one non-polar solvent, the binder polymer being selected from the group consisting of (a) a polymer containing an acidic functional group in such a proportion that the polymer has an acid number of from 0.5 to 15 mg-KOH/g, (b) a polymer containing a polyalkylene glycol chain in a proportion of from 0.5% to 40% by weight, and (c) a polymer containing an acidic functional group in such a proportion that the polymer has an acid number of from 0.5 to 15 mg-KOH/g and a polyalkylene glycol chain in a proportion of from 0.5% to 40% by weight.

2. The composition of claim 1, wherein the polymer has an acid number of from 1.0 to 10 mg-KOH/g.

3. The composition of claim 1, wherein the polymer contains from 2.0 % to 30% by weight of a polyalkylene glycol chain.

4. The composition of claim 1, wherein the polymer has an acid number of from 1.0 to 10 mg-KOH/g and contains from 2.0% to 30% by weight of a polyalkylene glycol chain.

5. The composition of of claim 1, wherein the tin-containing indium oxide powder contains 1–15 at % of Sn based on the sum of (In+Sn) and has an average primary particle diameter of not greater than 0.2 μm.

6. The composition of claim 1, wherein the weight ratio of tin-containing indium oxide powder to binder polymer is in the range of from 60:40 to 90:10.

7. The composition of claim 1, wherein the weight ratio of polar solvent to non-polar solvent in the mixed organic solvent is in the range of from 0.5:9.5 to 7:3.

8. The composition of claim 1, wherein the polar solvent is selected from the group consisting of alcohols and ketones, and the non-polar solvent is selected from the group consisting of aromatic hydrocarbons, alicyclic hydrocarbons, and aliphatic hydrocarbons.

9. A composition for forming a conductive film, which comprises a tin-containing indium oxide powder dispersed in a binder solution, wherein the binder is an actinic radiation-curable binder which comprises an acrylate or methacrylate compound containing an acid phosphate group in the molecule, the composition being curable by irradiation with actinic radiation.

10. The composition of claim 9, wherein the acrylate or methacrylate compound containing an acid phosphate group is present in a proportion of at least 2% by weight of the total weight of the binder.

11. The composition of claim 9, wherein the binder comprises, in addition to the acrylate or methacrylate compound containing an acid phosphate group, at least one radically polymerizable monomer or oligomer which is free of an acid phosphate group.

12. The composition of claim 11, wherein the acrylate or methacrylate compound containing an acid phosphate group is present in a proportion of from 2% to 50% by weight of the total weight of the binder.

13. The composition of claim 9, wherein the binder has an acid number of from 1 to 300 mg-KOH/g.

14. The composition of claim 9, wherein the tin-containing indium oxide powder contains 1–15 at % of Sn based on the sum of (In+Sn) and has an average primary particle diameter of not greater than 0.2 μm.

15. The composition of claim 9, wherein the weight ratio of tin-containing indium oxide powder to binder is in the range of from 60:40 to 90:10.

16. The composition of claim 9, wherein the binder solution further comprises a photoinitiator in a proportion of 0.1–20 parts by weight for each 100 parts by weight of the binder.

17. The composition of claim 1 wherein said polymer is derived from styrene, methyl acrylate and acrylic acid.

18. The composition of claim 1 wherein said polymer is derived from styrene, methyl acrylate, and methoxypolyethylene glycol methacrylate.

19. The composition of claim 1 wherein said polymer is derived from acrylic acid, styrene, methyl acrylate, and methoxypolyethylene glycol methacrylate.

20. The composition of claim 9 wherein said binder comprises a mixture of mono(2-methacryloylpolyoxyethyl) acid phosphate, diethylene glycol dimethacrylate, trimethylolpropane triacrylate and a polyester acrylate oligomer.

21. The composition of claim 9 wherein said binder comprises a mixture of di(2-methacryloyloxyethyl) acid phosphate, diethylene glycol dimethacrylate, trimethylolpropane triacrylate and a polyester acrylate oligomer.

22. The composition of claim 20 wherein said binder further includes acrylic acid.

23. The composition of claim 9 wherein said binder comprises a mixture of mono(2-methacryloylpolyoxyethyl) acid phosphate, trimethylolpropane triacrylate and a polyester acrylate oligomer.

24. The composition of claim 9 wherein said binder comprises a mixture of mono(2-methacryloylpolyoxyethyl) acid phosphate and polyurethane acrylate oligomer.

25. The composition of claim 1 wherein said solvent comprises a mixture of xylene and butanol.

* * * * *